United States Patent
Nakamura

(10) Patent No.: US 9,647,425 B1
(45) Date of Patent: May 9, 2017

(54) METHOD OF MANUFACTURING OPTICAL SEMICONDUCTOR DEVICE

(71) Applicant: Mitsubishi Electric Corporation, Tokyo (JP)

(72) Inventor: Naoki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/246,744

(22) Filed: Aug. 25, 2016

(30) Foreign Application Priority Data

Dec. 24, 2015 (JP) .................................. 2015-252124

(51) Int. Cl.
| | |
|---|---|
| *H01L 33/60* | (2010.01) |
| *H01S 5/323* | (2006.01) |
| *H01S 5/227* | (2006.01) |
| *H01S 5/026* | (2006.01) |
| *H01L 33/14* | (2010.01) |

(Continued)

(52) U.S. Cl.
CPC ...... *H01S 5/32308* (2013.01); *H01L 33/0066* (2013.01); *H01L 33/10* (2013.01); *H01L 33/145* (2013.01); *H01L 33/60* (2013.01); *H01S 5/026* (2013.01); *H01S 5/2275* (2013.01); *H01S 5/32333* (2013.01); *H01S 2304/04* (2013.01)

(58) Field of Classification Search
CPC . H01S 5/32308; H01S 5/026; H01L 55/2275; H01L 33/60; H01L 5/32333; H01L 33/145; H01L 33/10; H01L 21/0066
See application file for complete search history.

(56) References Cited

U.S. PATENT DOCUMENTS

| | | | |
|---|---|---|---|
| 6,455,338 B1 * | 9/2002 | Takagi | H01S 5/0265 438/24 |
| 6,528,337 B1 * | 3/2003 | Arakawa | B82Y 20/00 257/E33.008 |

(Continued)

FOREIGN PATENT DOCUMENTS

JP 2014-082411 A 5/2014

OTHER PUBLICATIONS

K. Iga ed. (1994) "Semiconductor Laser" Applied Physics Series, Ohmsha, p. 35.

(Continued)

*Primary Examiner* — Savitr Mulpuri
(74) *Attorney, Agent, or Firm* — Studebaker & Brackett PC

(57) ABSTRACT

A refractive index of the active layer is obtained by a photoluminescence inspection and an equivalent refractive index of the optical semiconductor element is computed. A refractive index of the optical waveguide layer is obtained by a photoluminescence inspection and an equivalent refractive index of the optical waveguide is computed. A film thickness of the refractive index adjustment layer is adjusted by etching the refractive index adjustment layer so that the equivalent refractive index of the optical semiconductor element and the equivalent refractive index of the optical waveguide are matched to each other. After adjusting the film thickness of the refractive index adjustment layer, a contact layer is formed on the second cladding layer and the refractive index adjustment layer. The optical waveguide is a passive waveguide to which no electrical field is applied and no current is injected.

5 Claims, 15 Drawing Sheets

(51) Int. Cl.
*H01L 33/10* (2010.01)
*H01L 33/00* (2010.01)

(56) References Cited

U.S. PATENT DOCUMENTS

| | | | | |
|---|---|---|---|---|
| 7,809,042 | B2* | 10/2010 | Makita | B82Y 20/00 |
| | | | | 372/43.01 |
| 8,637,337 | B2* | 1/2014 | Katsuyama | H01S 5/026 |
| | | | | 257/436 |
| 8,637,338 | B2* | 1/2014 | Katsuyama | H01S 5/026 |
| | | | | 257/436 |
| 8,741,670 | B2* | 6/2014 | Katsuyama | H01S 5/026 |
| | | | | 438/27 |
| 9,293,892 | B2* | 3/2016 | Nakayama | H01S 5/0604 |
| 9,397,474 | B2* | 7/2016 | Morita | H01S 5/34313 |
| 2004/0179569 | A1* | 9/2004 | Sato | H01S 5/06256 |
| | | | | 372/50.11 |
| 2008/0037605 | A1* | 2/2008 | Yamatoya | B82Y 20/00 |
| | | | | 372/45.01 |
| 2015/0078703 | A1* | 3/2015 | Park | H01S 5/026 |
| | | | | 385/14 |
| 2015/0092800 | A1* | 4/2015 | Zucker | H01S 5/0265 |
| | | | | 372/29.015 |
| 2016/0156154 | A1* | 6/2016 | Fuchida | H01S 5/12 |
| | | | | 372/50.11 |

OTHER PUBLICATIONS

M. J. Mondry et al. (1992) "Refractive Indexes of (Al, Ga, In) as Epilayers on InP for Optoelectronic Applications" IEEE Photonics Technology Letters, vol. 4, No. 6.

* cited by examiner

| | FILM THICKNESS [nm] | COMPOSITION (BANDGAP WAVELENGTH[μm]) |
|---|---|---|
| InGaAsP 10d | 20 | 1.086 |
| InGaAsP 10c | 20 | 1.096 |
| InGaAsP 10b | 20 | 1.106 |
| InGaAsP 10a | 20 | 1.126 |
| pInP | 20 | — |
| InGaAsP CORE LAYER | 230 | 1.126 |
| nInP | — | — |

REFRACTIVE INDEX ADJUSTMENT LAYER: InGaAsP 10d, 10c, 10b, 10a

METHOD OF MANUFACTURING OPTICAL SEMICONDUCTOR DEVICE

BACKGROUND OF THE INVENTION

Field

The present invention relates to a method of manufacturing an optical semiconductor device wherein an optical semiconductor element and an optical waveguide are monolithically integrated.

Background

With the increase in optical communication traffic in recent years, optical semiconductor devices capable of high-speed operation have been developed. A substantial number of such optical semiconductor devices is of a structure in which an optical semiconductor element such as a semiconductor laser or an optical modulator and an optical waveguide are monolithically integrated (see, for example, JP 2014-82411 A).

SUMMARY

If an equivalent refractive index of the optical semiconductor element and an equivalent refractive index of the optical waveguide are not matched to each other in the integrated device, a mode mismatch loss of propagating guided wave light occurs and an end surface emergent light output characteristic degrades. Instability of laser operation, appearing, for example, as a kink due to reflected return light, is also caused.

Conventionally, the composition of the active layer of the optical semiconductor element and the composition of the optical waveguide layer of the optical waveguide are controlled to match the equivalent refractive indices to each other. However, there is a possibility of failure to make the composition of the active layer and the composition of the optical waveguide layer equal to each other due to manufacturing variation and, hence, a mismatch between the equivalent refractive index of the optical semiconductor element and the equivalent refractive index of the optical waveguide occurs. Also, each of the equivalent refractive indices is determined at the point in time at which the crystal growth of the corresponding structure is completed, and it is difficult to thereafter correct the determined refractive index.

In view of the above-described problem, an object of the present invention is to provide a method of manufacturing an optical semiconductor device capable of correcting a mismatch in equivalent refractive index due to manufacturing variation.

According to the present invention, a method of manufacturing an optical semiconductor device includes: successively laying a first cladding layer, an active layer and a second cladding layer on a semiconductor substrate to form an optical semiconductor element; obtaining a refractive index of the active layer by a photoluminescence inspection and computing an equivalent refractive index of the optical semiconductor element; successively laying a third cladding layer, an optical waveguide layer jointed to the active layer and having a refractive index smaller than that of the active layer, and a refractive index adjustment layer on the semiconductor substrate to form an optical waveguide; obtaining a refractive index of the optical waveguide layer by a photoluminescence inspection and computing an equivalent refractive index of the optical waveguide; adjusting a film thickness of the refractive index adjustment layer by etching the refractive index adjustment layer so that the equivalent refractive index of the optical semiconductor element and the equivalent refractive index of the optical waveguide are matched to each other; and after adjusting the film thickness of the refractive index adjustment layer, forming a contact layer on the second cladding layer and the refractive index adjustment layer, wherein the optical waveguide is a passive waveguide to which no electrical field is applied and no current is injected.

In the present invention, the optical semiconductor element and the optical waveguide are formed; their equivalent refractive indices of the optical semiconductor element are thereafter obtained by photoluminescence inspection; and the film thickness of the refractive index adjustment layer is adjusted by etching the refractive index adjustment layer so that the equivalent refractive indices are matched to each other. A mismatch in equivalent refractive index due to manufacturing variation can be corrected thereby.

Other and further objects, features and advantages of the invention will appear more fully from the following description.

DESCRIPTION OF EMBODIMENTS

A method of manufacturing an optical semiconductor device according to the embodiments of the present invention will be described with reference to the drawings. The same components will be denoted by the same symbols, and the repeated description thereof may be omitted.

First Embodiment

Figure 1:
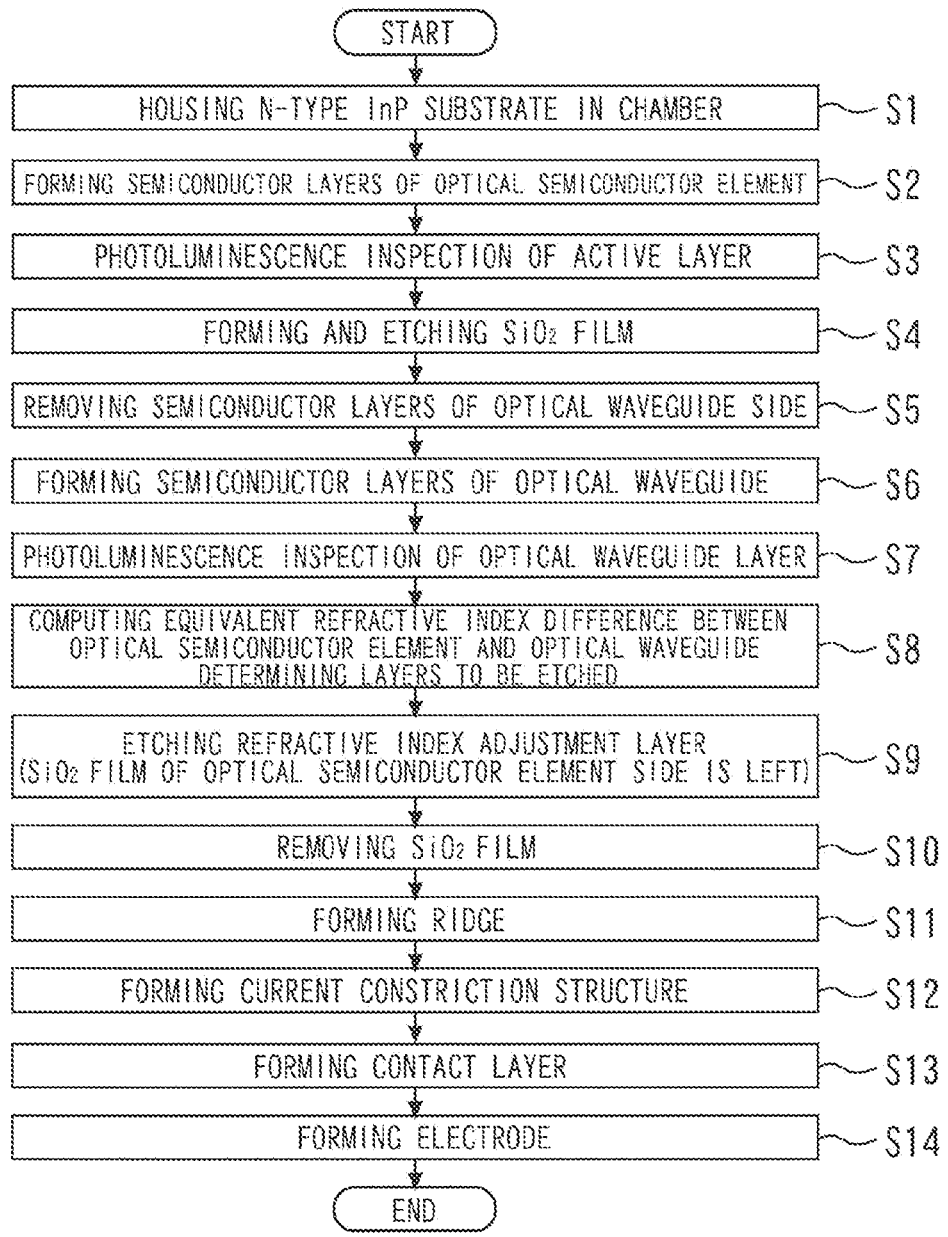
FIG. 1 is a flowchart of a method of manufacturing an optical semiconductor device according to a first embodiment of the present invention.
Figure 15:
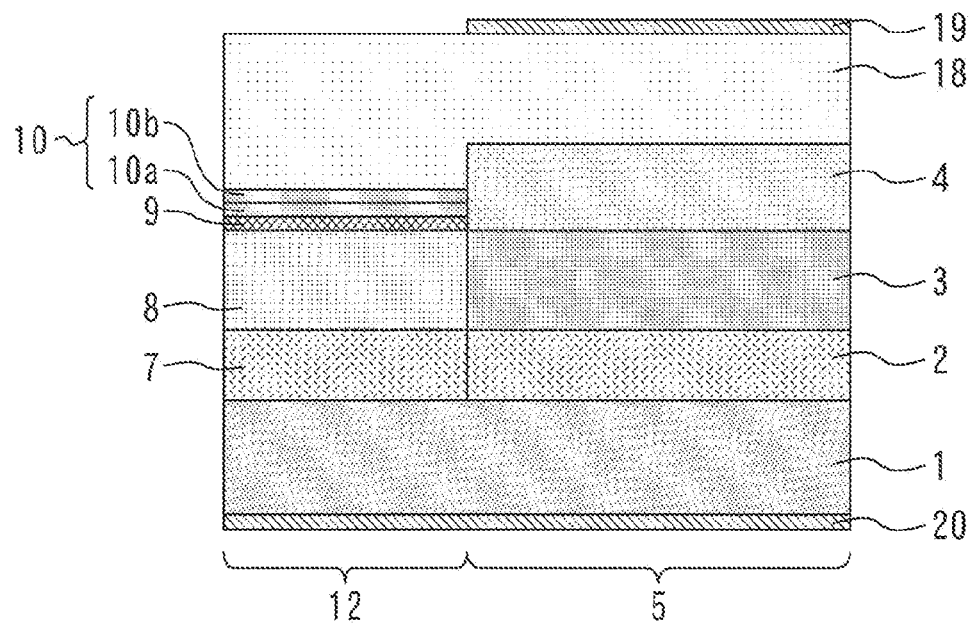
Figure 16:
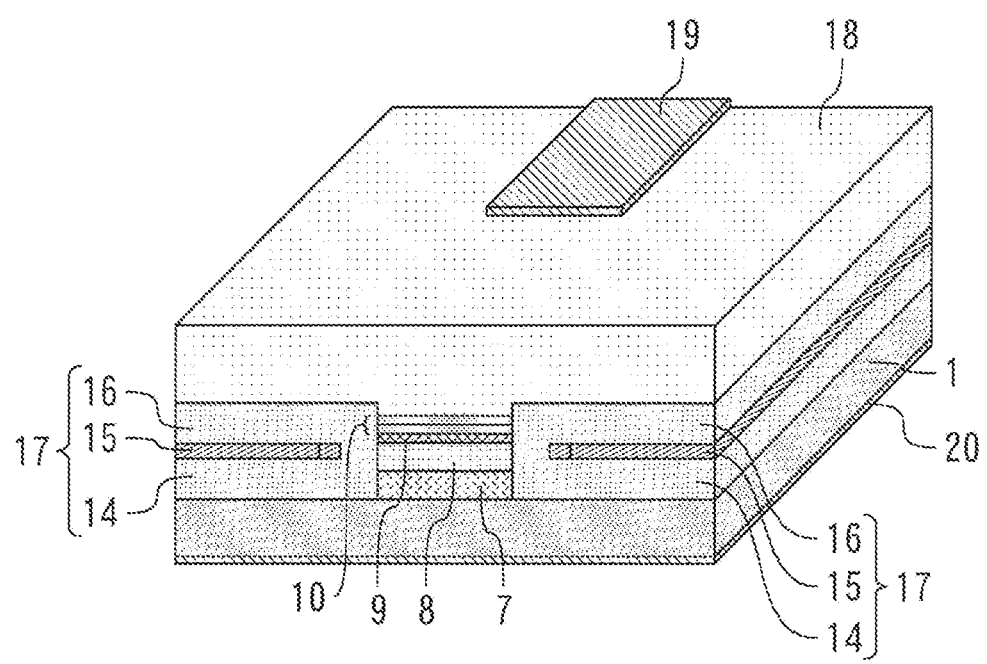
FIG. 16 is a perspective view of the optical semiconductor device according to the first embodiment of the present invention.
Figure 17:
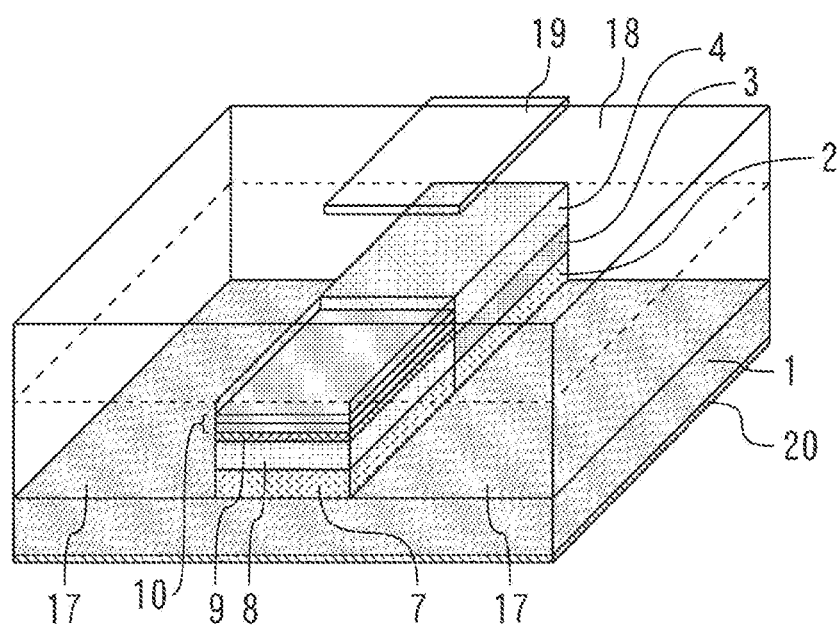
FIG. 17 is a see-through perspective view of internal portions of the optical semiconductor device according to the first embodiment of the present invention.

FIG. 1 is a flowchart of a method of manufacturing an optical semiconductor device according to a first embodiment of the present invention. FIGS. 2 to 15 are sectional views showing the method of manufacturing an optical semiconductor device according to the first embodiment of the present invention. FIGS. 2 to 9, and 13 are sectional views taken along a resonator direction, while FIGS. 10 to 12, and 14 are sectional views perpendicular to the resonator direction. FIG. 16 is a perspective view of the optical semiconductor device according to the first embodiment of the present invention. FIG. 17 is a see-through perspective view of internal portions of the optical semiconductor device according to the first embodiment of the present invention. The method of manufacturing an optical semiconductor device according to the present embodiment will be described with reference to these figures.

Figure 2:
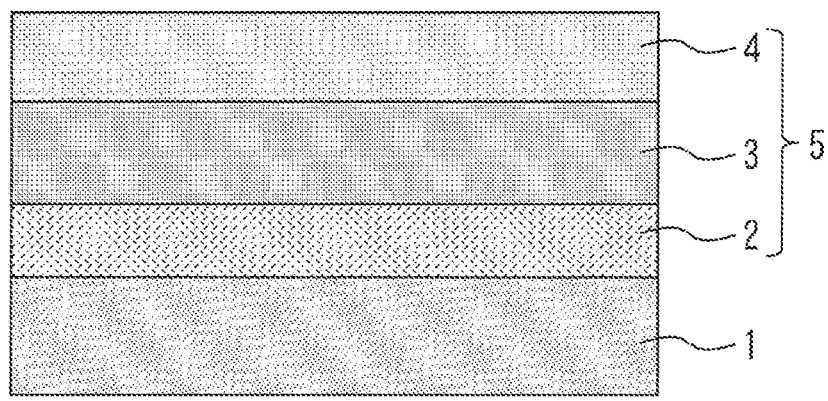
FIGS. 2 to 15 are sectional views showing the method of manufacturing an optical semiconductor device according to the first embodiment of the present invention.

First, referring to FIG. 2, an n-type InP substrate 1 is housed in a chamber (step S1), and an n-type InP cladding layer 2, an active layer 3 and a p-type InP cladding layer 4 are successively laid on the n-type InP substrate 1 by metal organic chemical vapor deposition (MOCVD) to form an optical semiconductor element 5 (step S2). The optical semiconductor element 5 in the present embodiment is a laser diode.

Subsequently, the refractive index of the active layer 3 is obtained by evaluating the wavelength of emission from the active layer 3 by a photoluminescence inspection (step S3). In photoluminescence measurement, light of a particular wavelength is applied to the substrate on which the active layer 3 is formed and the emission therefrom is measured. Measurement results are used, for example, to evaluate the bandgap and composition. Independently of whether the material of the active layer 3 is InGaAsP or AlGaInAs, the refractive index can be calculated by ascertaining the composition (see, for example, Semiconductor Lasers, Applied Physics Series, Ohmsha, p. 35, and Refractive Indexes of (Al, Ga, In) As Epilayers on InP for Optoelectronic Applications, M. J. Mondry, et al., IEEE PHOTONICS TECHNOLOGY LETTERS, VOL. 4, NO. 6, June 1992).

Figure 3:
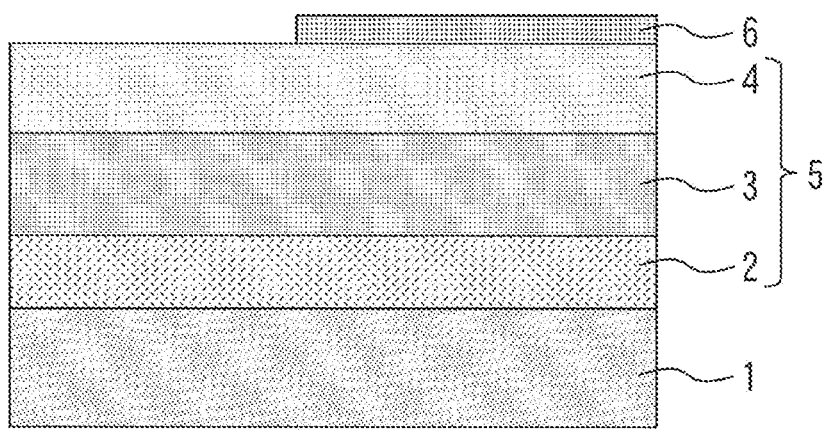
Figure 4:
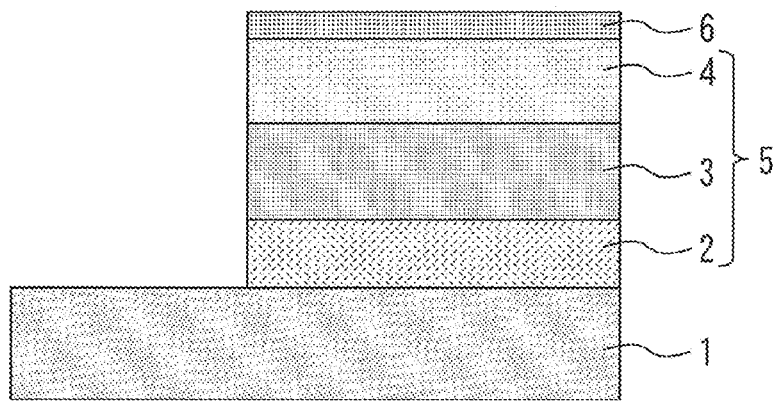

Subsequently, as shown in FIG. 3, SiO$_2$ film 6 is formed and an unnecessary portion of the SiO$_2$ film 6 is removed (step S4) while leaving a portion of the SiO$_2$ film 6 only in a place where the optical semiconductor element 5 is to be left. Subsequently, as shown in FIG. 4, unnecessary portions of the n-type InP cladding layer 2, active layer 3 and p-type InP cladding layer 4 are removed by performing dry etching or wet etching with the SiO$_2$ film 6 used as a mask (step S5).

Figure 5:
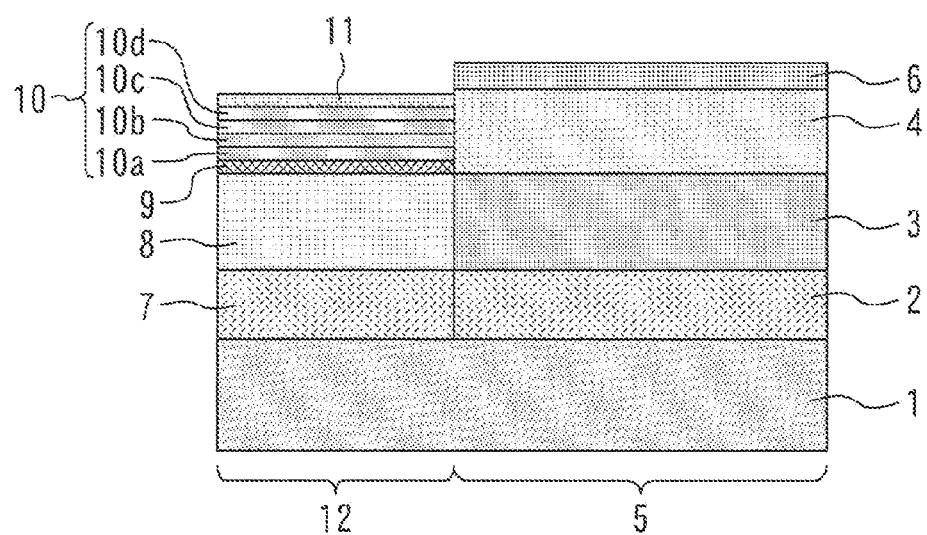

Subsequently, as shown in FIG. 5, an n-type InP cladding layer 7, an optical waveguide layer 8 of InGaAsP, a 20 nm-thick InP layer 9, a refractive index adjustment layer 10 and a p-type InP cladding layer 11 are successively laid on the n-type InP substrate 1, with the SiO$_2$ film 6 used as a selective growth mask, thereby forming an optical waveguide 12. The optical waveguide layer 8 may alternatively be AlGaInAs. The optical waveguide layer 8 has its side surface jointed to a side surface of the active layer 3 and has a refractive index smaller than that of the active layer 3.

The refractive index adjustment layer 10 includes a plurality of InGaAsP layers 10a, 10b, 10c, and 10d each having a layer thickness of 20 nm and having component ratios graded in steps of 20 nm in the wavelength decreasing direction from the optical waveguide layer 8 toward the p-type InP cladding layer 11. Since InGaAsP is a material having a smaller refractive index in a shorter-wavelength composition, the InGaAsP layers 10a, 10b, 10c, and 10d have refractive indices in decreasing order from the optical waveguide layer 8 side. This arrangement enables preventing the distribution of guided light from expanding to the p-type InP cladding layer 11 side. Each of the compositions of the layers in the refractive index adjustment layer 10 can be set in such a range that guided light is not influenced by band end absorption, and each of the layer thickness and the number of layers can be freely set.

Subsequently, the refractive index of the optical waveguide layer 8 is obtained by evaluating the wavelength of emission from the optical waveguide layer 8 by photoluminescence inspection (step S7). The same measuring method as that in the case of obtaining the refractive index of the active layer 3 is used.

Subsequently, an equivalent refractive index of the optical semiconductor element 5 and an equivalent refractive index of the optical waveguide 12 are computed by numeric computation. Then a film thickness of the refractive index adjustment layer 10 with which the two equivalent refractive indices are matched to each other is computed (step S8).

Subsequently, the film thickness of the refractive index adjustment layer 10 is adjusted by etching the refractive index adjustment layer 10 on the basis of the computation result so that the equivalent refractive index of the optical semiconductor element 5 and the equivalent refractive index of the optical waveguide 12 are matched to each other (step S9).

Figure 6:
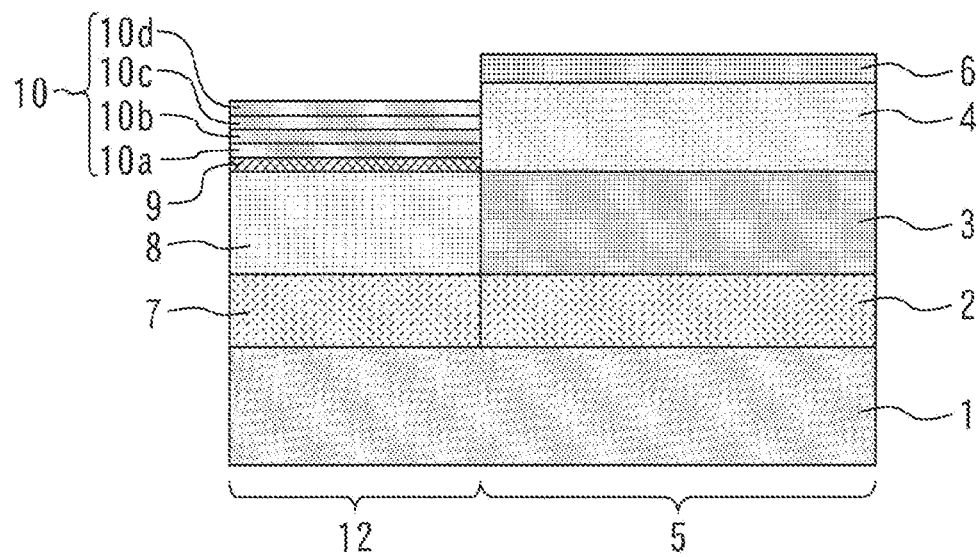
Figure 7:
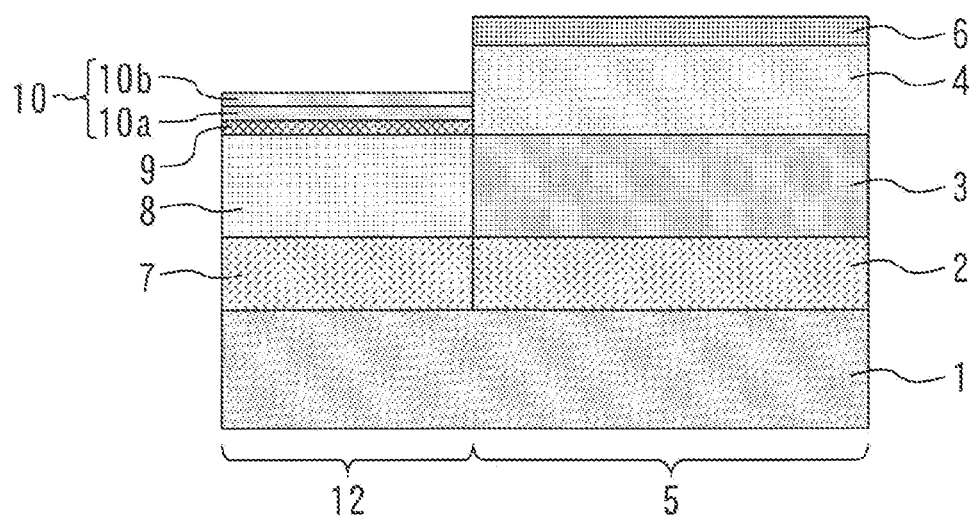

More specifically, as shown in FIG. 6, the p-type InP cladding layer 11 is removed by wet etching using, for example, a solution of a mixture of hydrochloric acid and phosphoric acid, with the SiO$_2$ film 6 left as a mask. Subsequently, as shown in FIG. 7, the InGaAsP layer in the refractive index adjustment layer 10 is etched by using a solution of a mixture of tartaric acid and hydrogen peroxide solution.

Figures 18, 19:
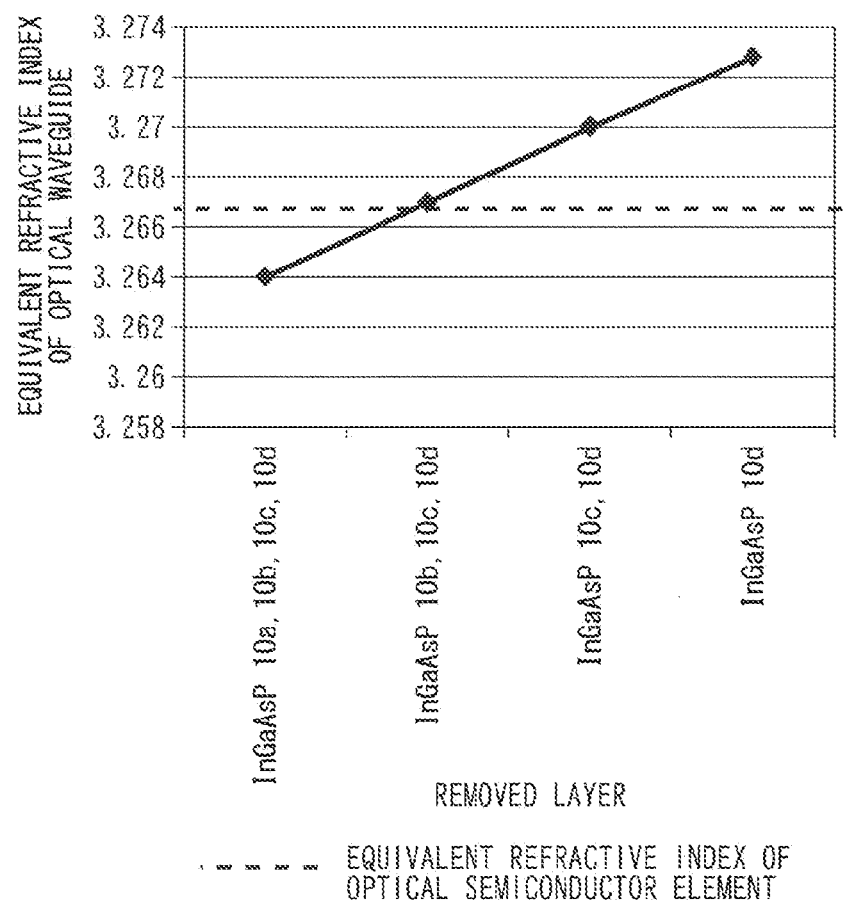
FIG. 18 is a diagram showing an example of the layer construction of the optical waveguide.
FIG. 19 is a diagram showing the relationship between the equivalent refractive index and the number of removed layers of the refractive index adjustment layer necessary for equivalent refractive index matching.

FIG. 18 is a diagram showing an example of the layer construction of the optical waveguide. FIG. 19 is a diagram showing the relationship between the equivalent refractive index and the number of removed layers of the refractive index adjustment layer necessary for equivalent refractive index matching. Computation is performed with respect to a case where the active layer 3 is an AlGaInAs-based material, the equivalent refractive index of the optical semiconductor element 5 is 3.267 and the compositions of the optical waveguide layer 8 and the refractive index adjustment layer 10 are such that the wavelength is reduced by 20 nm through the entire layer. It can be understood that matching of the equivalent refractive index of the optical semiconductor element 5 and the equivalent refractive index of the optical waveguide 12 can be achieved by removing the InGaAsP layers 10b, 10c and 10d.

Particular ones of the InGaAsP layers can be etched by adjusting the mixture ratio of tartaric acid and hydrogen peroxide solution. The etching rate changes depending on the compositions of the InGaAsP layers while the mixture ratio is fixed. Selective etching can therefore be performed. Also, etching can be performed with sufficiently high accuracy because the etching rate is about 10 nm per minute.

Forming the refractive index adjustment layer 10 of the InGaAsP-based material enables use of an etchant of a low etching rate in etching of the refractive index adjustment layer 10. The refractive index adjustment layer 10 may be formed of an AlGaInAs-based material. However, it is difficult to prepare an etchant of a low etching rate for etching on AlGaInAs. The tartaric acid-hydrogen peroxide mixture solution is not exclusively used. A solution of a mixture of a different organic acid and hydrogen peroxide solution may alternatively be used. Also, wet etching is not exclusively used. Dry etching may alternatively be used.

The amount of etching of the refractive index adjustment layer 10 is adjusted by controlling the etching time. The InP layer 9 functions as an etching stopper on the tartaric acid-hydrogen peroxide mixture solution but is not necessarily required in the case where the etching time is controlled.

The optical waveguide layer 8 in the optical waveguide 12 is designed so that the equivalent refractive index of the optical waveguide 12 is smaller than the equivalent refractive index of the optical semiconductor element 5 in the case of the conventional structure not provided with the refractive index adjustment layer 10. That is, the refractive index of the optical waveguide layer 8 in the optical waveguide 12 is set to a value smaller than the refractive index of the active layer 3 and is adjusted with the refractive index adjustment layer 10 on the optical waveguide layer 8. By this adjustment, the equivalent refractive index of the optical waveguide 12 can be increased but cannot be reduced. Therefore such a setting is made. Also, it is necessary that the equivalent refractive index of the optical waveguide 12 before refractive index adjustment be larger than the equivalent refractive index of the optical semiconductor element 5.

Figure 8:
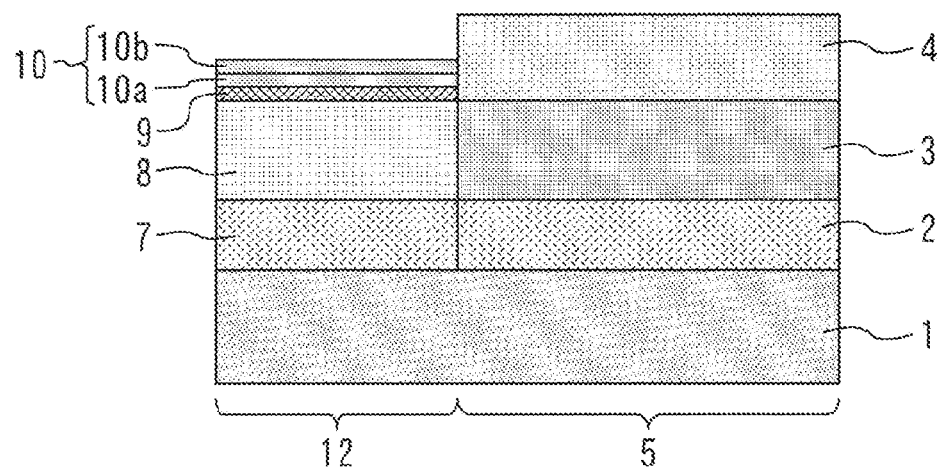
Figure 9:
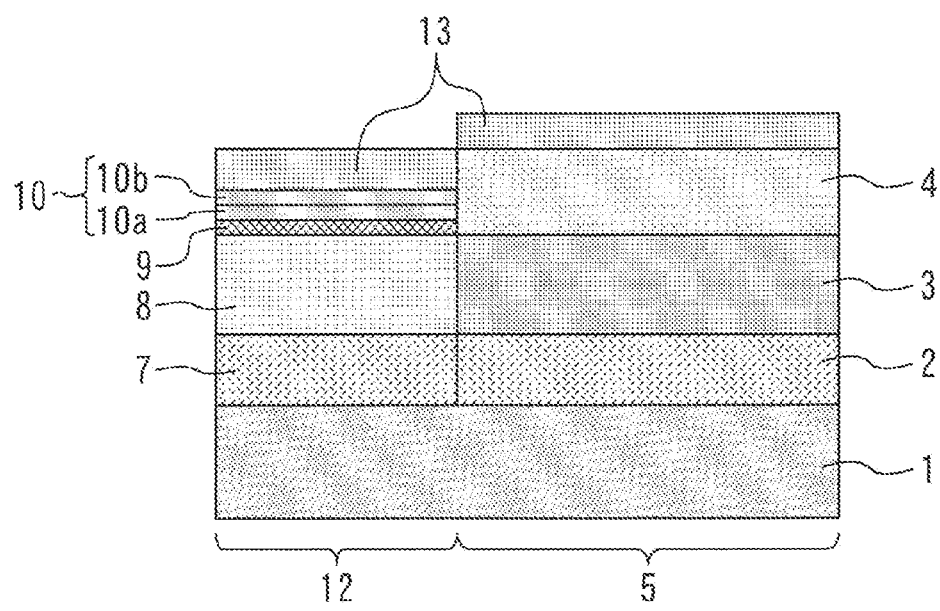
Figure 10:
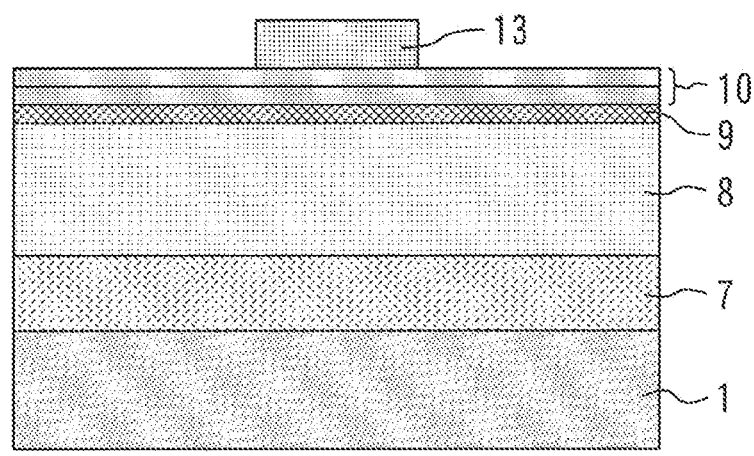
Figure 11:
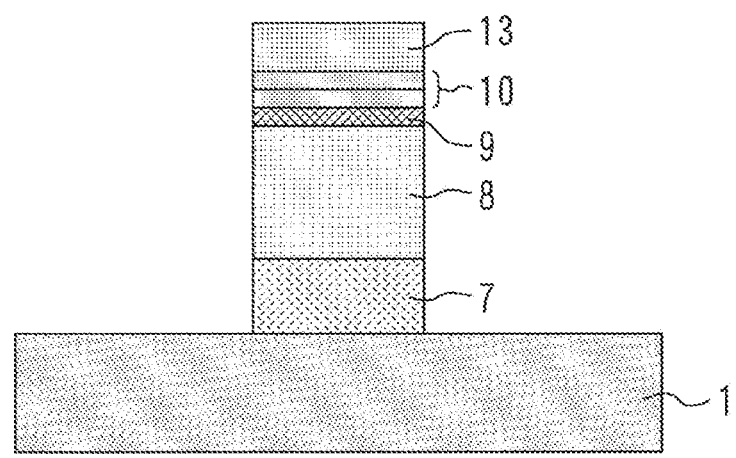

Subsequently, as shown in FIG. 8, the $SiO_2$ film 6 is removed by using an etchant such as hydrofluoric acid (step S10). Subsequently, as shown in FIGS. 9 and 10, $SiO_2$ film 13 is newly formed and worked into the shape of a stripe having a width of about 1 to 2 μm. Subsequently, as shown in FIG. 11, a ridge is formed by performing dry etching using the $SiO_2$ film 13 as a mask (step S11). Wet etching may be performed instead of dry etching.

Figure 12:
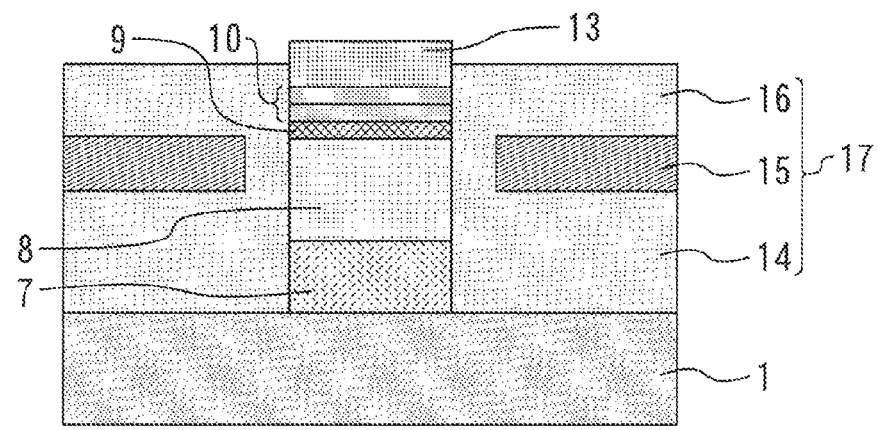

Subsequently, as shown in FIG. 12, a p-type InP layer 14, an n-type InP layer 15 and a p-type InP layer 16 are successively laid along ridge side surfaces by MOCVD using as a selective growth mask the $SiO_2$ film 13 used at the time of ridge forming, thereby forming a current constriction structure 17 (step S12). The current constriction structure 17 may use a semi-insulating semiconductor.

Figure 13:
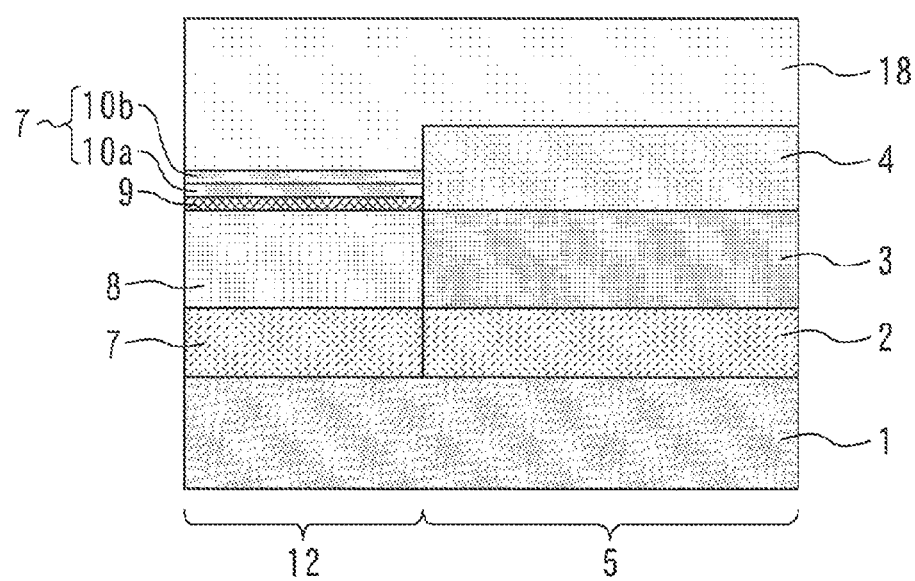
Figure 14:
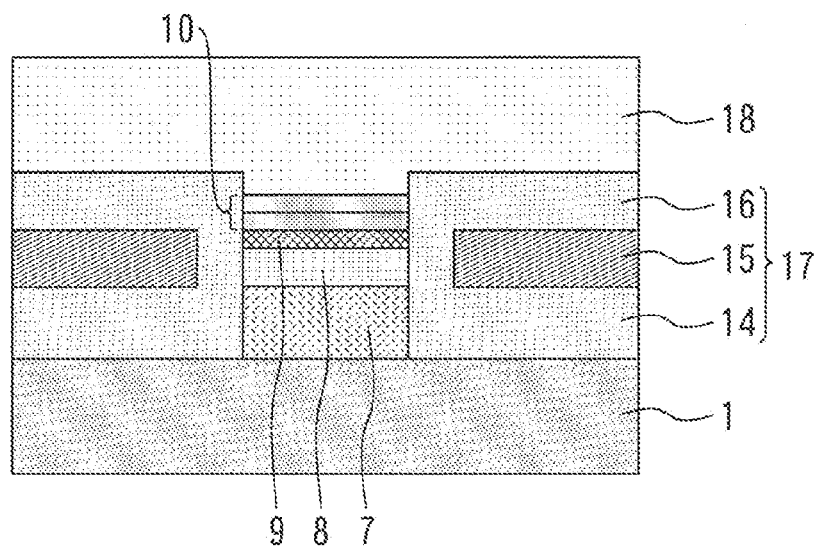

Subsequently, as shown in FIGS. 13 and 14, the $SiO_2$ film 13 is removed, for example, by hydrofluoric acid, and a p-type contact layer 18 is formed by MOCVD on the p-type InP cladding layer 4, the refractive index adjustment layer 10 and the current constriction structure 17 (step S13). Subsequently, as shown in FIG. 15, a p-side electrode 19 and an n-side electrode 20 are formed (step S14). The p-side electrode 19 is formed not on the optical waveguide 12 but only on the optical semiconductor element 5. Also, a band discontinuity occurs in the refractive index adjustment layer 10, so that the current injection is impeded. Accordingly, the optical waveguide 12 is a passive waveguide having no current injected thereinto. The n-side electrode 20 is formed on the entire back surface of the n-type InP substrate 1. However, the n-side electrode 20 may alternatively be formed only on the optical semiconductor element 5. A structure, such as shown in FIGS. 16 and 17, in which the optical semiconductor element 5 and the optical waveguide 12 are integrated, is manufactured by the above-described process steps.

In the present embodiment, as described above, the optical semiconductor element 5 and the optical waveguide 12 are formed; equivalent refractive indices of the optical semiconductor element 5 and the optical waveguide 12 are thereafter obtained by photoluminescence inspection; and the film thickness of the refractive index adjustment layer 10 is adjusted by etching the refractive index adjustment layer 10 so that the two equivalent refractive indices are matched to each other. A mismatch in equivalent refractive index due to manufacturing variation can be corrected thereby. Since the adjustment is made by etching after crystal growth, matching can easily be achieved in the wafer process.

Figure 20:
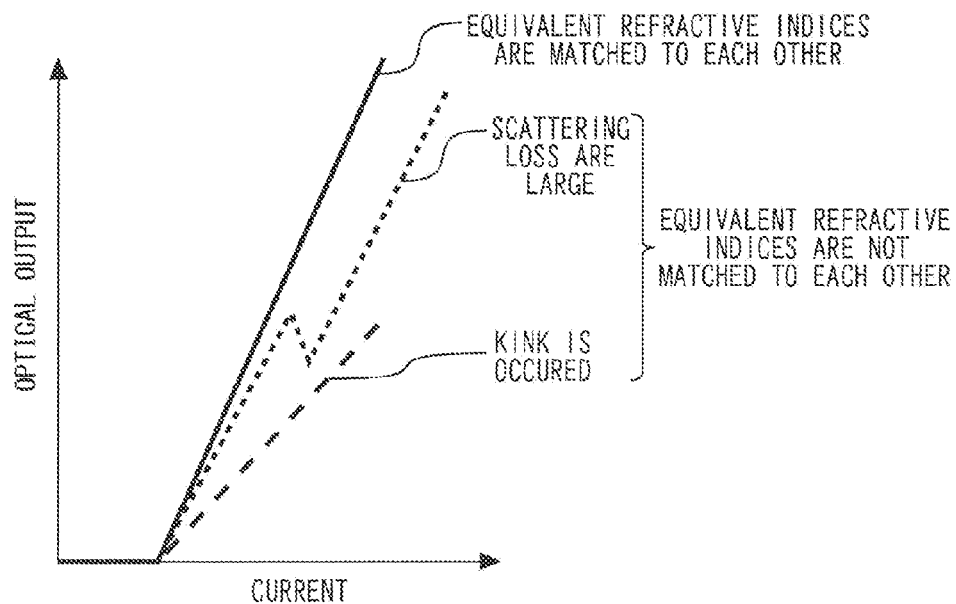
FIG. 20 is a diagram showing a current-optical output characteristic of the optical semiconductor device when the equivalent refractive indices are matched to each other and a current-optical output characteristic of the optical semiconductor device when the equivalent refractive indices are not matched to each other.

FIG. 20 is a diagram showing a current-optical output characteristic of the optical semiconductor device when the equivalent refractive indices are matched to each other and a current-optical output characteristic of the optical semiconductor device when the equivalent refractive indices are not matched to each other. By matching the equivalent refractive indices, degradations of I-L characteristics such as a kink due to reflected return light and a reduction in slope efficiency due to scattering loss can be inhibited.

In the present embodiment, the refractive index adjustment layer 10 is formed of a plurality of InGaAsP layers differing in composition from each other. The refractive index adjustment layer 10 may alternatively be one InGaAsP layer uniform in composition. The InGaAsP layers differing in composition from each other, however, have different etching rates and therefore make easier the adjustment of the film thickness of the refractive index adjustment layer 10 performed by etching.

Second Embodiment

Figure 21:
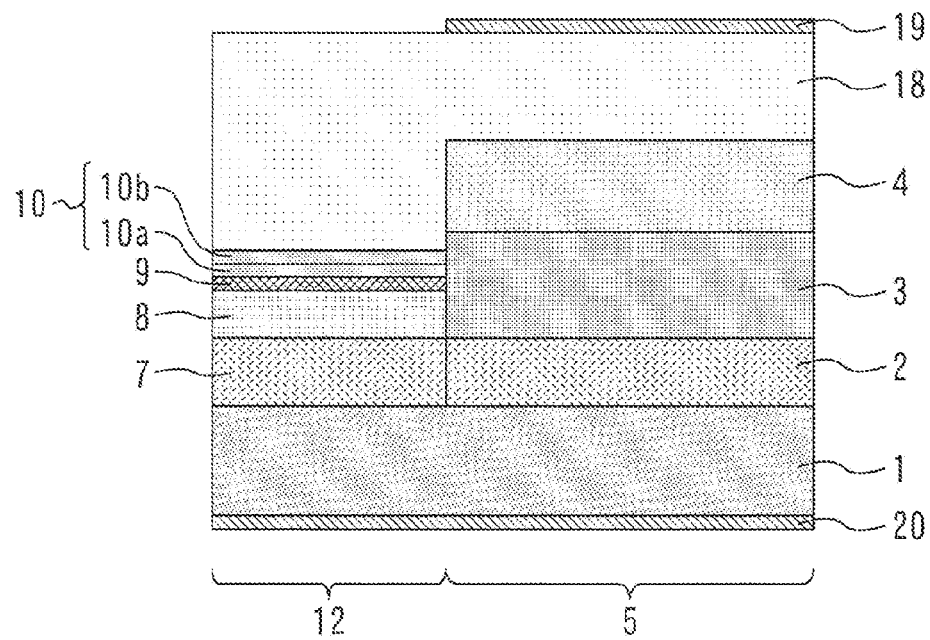
FIG. 21 is a sectional view showing a method of manufacturing an optical semiconductor device according to a second embodiment of the present invention.

FIG. 21 is a sectional view showing a method of manufacturing an optical semiconductor device according to a second embodiment of the present invention. In the first embodiment, the refractive index distribution center of the optical waveguide 12 is offset relative to the refractive index distribution center of the optical semiconductor element 5. To correct this, in the present embodiment, the film thickness of the optical waveguide layer 8 is reduced relative to the film thickness of the active layer 3 so that the refractive index distribution center of the optical waveguide 12 does not offset relative to the refractive index distribution center of the optical semiconductor element 5. An AlGaInAs material is used for the active layer 3, thereby preventing the active layer 3 from being etched when the refractive index adjustment layer 10 is etched. In other respects, the construction and advantages of the second embodiment are the same as those in the first embodiment.

Third Embodiment

Figure 22:
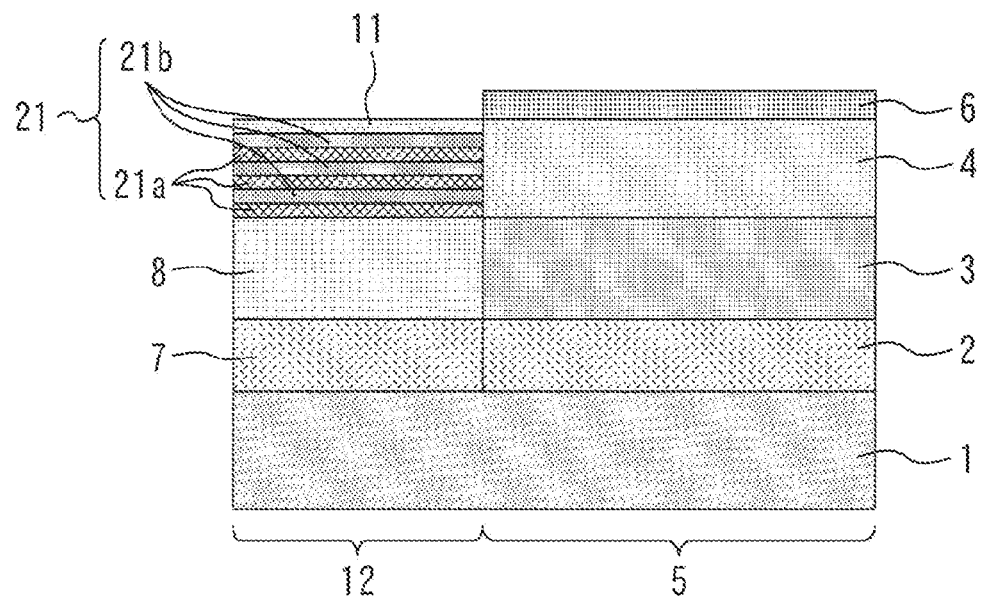
FIGS. 22 to 24 are sectional views showing a method of manufacturing an optical semiconductor device according to a third embodiment of the present invention.
Figure 23:
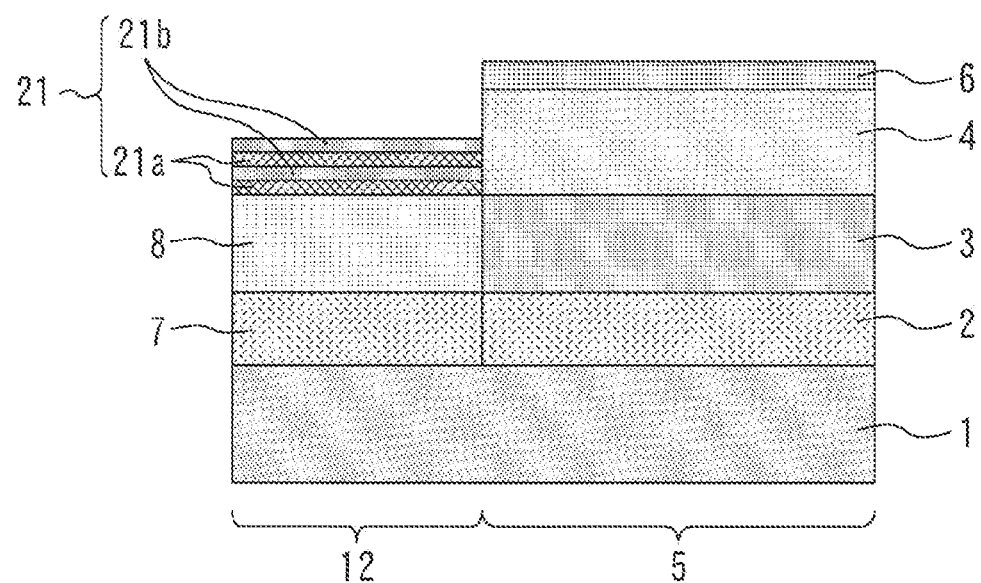
Figure 24:
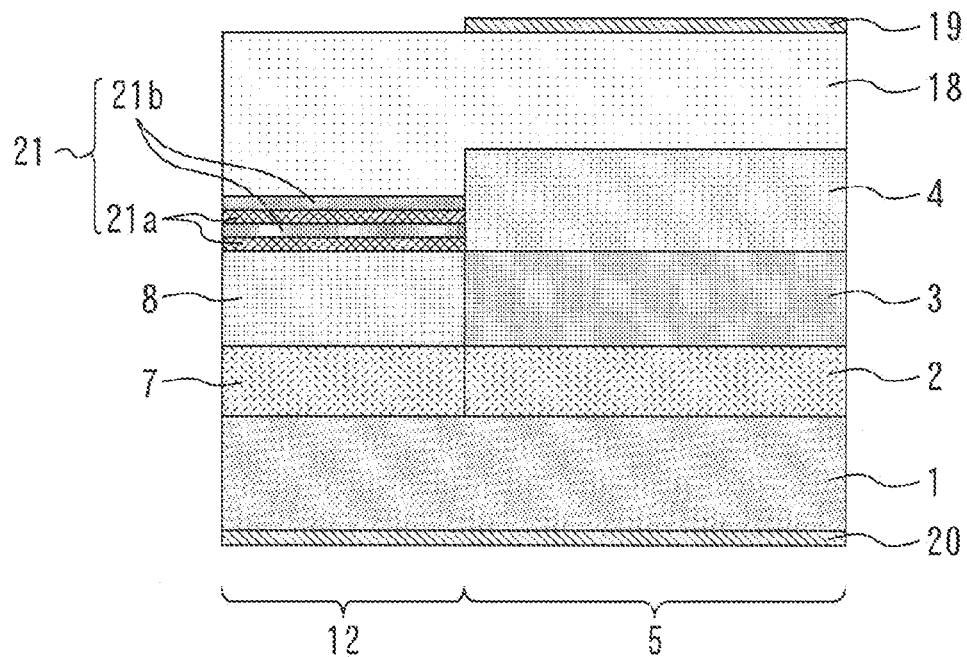

FIGS. 22 to 24 are sectional views showing a method of manufacturing an optical semiconductor device according to a third embodiment of the present invention.

The steps shown in FIGS. 1 to 4 are performed, as in the first embodiment. Subsequently, as shown in FIG. 22, an n-type InP cladding layer 7, an optical waveguide layer 8 of InGaAsP, a refractive index adjustment layer 21 and a p-type InP cladding layer 11 are successively laid on an n-type InP substrate 1, with $SiO_2$ film 6 used as a selective growth mask, thereby forming an optical waveguide 12.

The refractive index adjustment layer 21 in the present embodiment differs from the refractive index adjustment layer 10 in the first embodiment in that two different types of semiconductor layers: an InP layer 21a and an InGaAsP layer 21b are alternately laid one on another. The film thickness of each of these layers is 20 nm. The composition of the InGaAsP layer 21b is selected in such a range that guided light is not influenced by band end absorption, as in the first embodiment. The layer contacting the InGaAsP optical waveguide layer 8 may be the InP layer 21a or the InGaAsP layer 21b. The layer thickness of each layer and the number of pairs of the layers can be freely set.

Subsequently, the refractive index of the optical waveguide layer 8 is obtained by evaluating the wavelength of emission from the optical waveguide layer 8 by photoluminescence inspection, as in the first embodiment. An equivalent refractive index of the optical semiconductor element 5 and an equivalent refractive index of the optical waveguide 12 are computed by numeric computation. A film thickness of the refractive index adjustment layer 10 with which the two equivalent refractive indices are matched to each other is then computed.

Subsequently, as shown in FIG. 23, the p-type InP cladding layer 11 is removed by wet etching using, for example, a solution of a mixture of hydrochloric acid and phosphoric acid. The film thickness of the refractive index adjustment layer 21 is adjusted by etching the refractive index adjustment layer 21 so that the equivalent refractive index of the optical semiconductor element 5 and the equivalent refractive index of the optical waveguide 12 are matched to each other. It is desirable to use an etchant of a low etching rate, e.g., a solution of a mixture of hydrochloric acid and phosphoric acid for etching of the InP layer 21a. A mixture of tartaric acid and hydrogen peroxide solution is used for etching of the InGaAsP layer 21b. While etching is performed by controlling the etching time in the first embodiment, the InP layer 21a and the InGaAsP layer 21b alternately function as an etching stopper layer in the present embodiment and, therefore, etching time control is not necessary in the present embodiment.

The same process steps as those in the first embodiment are thereafter performed, thereby manufacturing the optical semiconductor device according to the present embodiment, as shown in FIG. 24.

In the present embodiment, as described above, the optical semiconductor element 5 and the optical waveguide 12 are formed; equivalent refractive indices of the optical semiconductor element 5 and the optical waveguide 12 are thereafter obtained by photoluminescence inspection; and the number of pairs of InP layer 21a and InGaAsP layer 21b is adjusted by etching the refractive index adjustment layer 21 so that the two equivalent refractive indices are matched to each other, thus obtaining the same advantages as those of the first embodiment.

In the present embodiment, the refractive index adjustment layer 21 has two types of semiconductor layers formed of different materials and alternately laid one on another. However, the refractive index adjustment layer 21 may alternatively have two types of semiconductor layers formed of the same material, having different compositions and alternately laid one on another.

Fourth Embodiment

Figure 25:
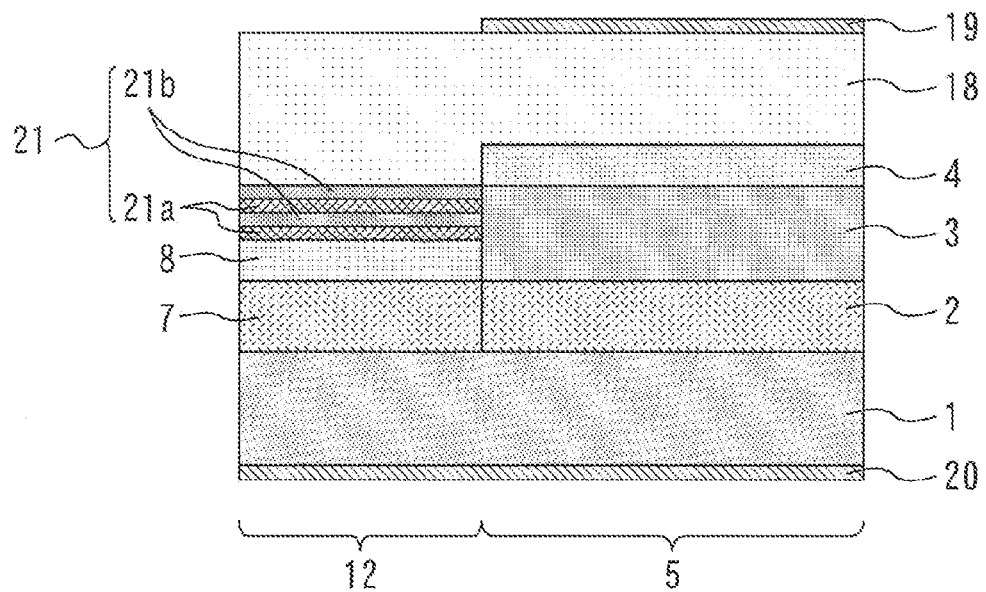
FIG. 25 is sectional view showing a method of manufacturing an optical semiconductor device according to a fourth embodiment of the present invention.

FIG. 25 is sectional view showing a method of manufacturing an optical semiconductor device according to a fourth embodiment of the present invention. In the third embodiment, the refractive index distribution center of the optical waveguide 12 is offset relative to the refractive index distribution center of the optical semiconductor element 5. To correct this, in the present embodiment, the film thickness of the optical waveguide layer 8 is reduced relative to the film thickness of the active layer 3. Making the refractive index distribution center of the optical waveguide 12 offset relative to the refractive index distribution center of the optical semiconductor element 5 is avoided thereby. An AlGaInAs material is used for the active layer 3, thereby preventing the active layer 3 from being etched when the refractive index adjustment layer 21 is etched. In other respects, the construction and advantages of the fourth embodiment are the same as those in the third embodiment.

Figure 26:
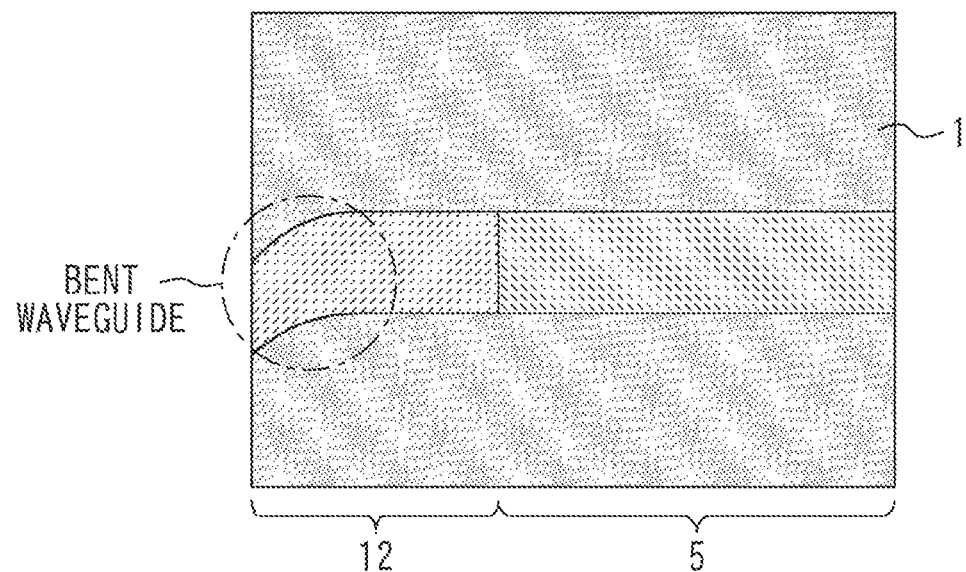
FIG. 26 is a plan view showing a modified example of the optical semiconductor devices according to the first to fourth embodiments of the present invention.

FIG. 26 is a plan view showing a modified example of the optical semiconductor devices according to the first to fourth embodiments of the present invention. The optical waveguide 12 may be a bent waveguide, such as illustrated.

While the devices according to the first to fourth embodiments are each an optical waveguide integrated semiconductor laser formed on the n-type InP substrate 1, the same advantages can also be obtained with an optical waveguide integrated structure made on a p-type substrate. Also, in the case of an integrated optical semiconductor device in which the optical waveguide 12 is a non-current-injection passive optical waveguide, the same advantages can be obtained. The optical semiconductor element 5 is not limited to the laser diode. The optical semiconductor element 5 may be an array-type laser or optical modulator.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-252124, filed on Dec. 24, 2015 including specification, claims, drawings and summary, on which the Convention priority of the present application is based, is incorporated herein by reference in its entirety.

The invention claimed is:

1. A method of manufacturing an optical semiconductor device comprising:
   successively laying a first cladding layer, an active layer and a second cladding layer on a semiconductor substrate to form an optical semiconductor element;
   obtaining a refractive index of the active layer by a photoluminescence inspection and computing an equivalent refractive index of the optical semiconductor element;
   successively laying a third cladding layer, an optical waveguide layer jointed to the active layer and having a refractive index smaller than that of the active layer, and a refractive index adjustment layer on the semiconductor substrate to form an optical waveguide;
   obtaining a refractive index of the optical waveguide layer by a photoluminescence inspection and computing an equivalent refractive index of the optical waveguide;
   adjusting a film thickness of the refractive index adjustment layer by etching the refractive index adjustment layer so that the equivalent refractive index of the optical semiconductor element and the equivalent refractive index of the optical waveguide are matched to each other; and
   after adjusting the film thickness of the refractive index adjustment layer, forming a contact layer on the second cladding layer and the refractive index adjustment layer,
   wherein the optical waveguide is a passive waveguide to which no electrical field is applied and no current is injected.

2. The method of manufacturing an optical semiconductor device of claim 1, wherein the refractive index adjustment layer includes a plurality of semiconductor layers having refractive indices in decreasing order from the optical waveguide layer.

3. The method of manufacturing an optical semiconductor device of claim 1, wherein the refractive index adjustment layer includes two different types of semiconductor layers alternately laid one on another.

4. The method of manufacturing an optical semiconductor device of claim 1, wherein a film thickness of the optical waveguide layer is reduced relative to a film thickness of the active layer so that a refractive index distribution center of the optical waveguide does not offset relative to a refractive index distribution center of the optical semiconductor element.

5. The method of manufacturing an optical semiconductor device of claim 4, comprising preventing the active layer from being etched when the refractive index adjustment layer is etched.

* * * * *